United States Patent [19]

Sweetana

[11] Patent Number: 4,577,148
[45] Date of Patent: Mar. 18, 1986

[54] SURGE ARRESTER EQUIPPED FOR MONITORING FUNCTIONS AND METHOD OF USE

[75] Inventor: Andrew S. Sweetana, Bloomington, Ind.

[73] Assignee: Westinghouse Electric Corp., Pittsburgh, Pa.

[21] Appl. No.: 450,584

[22] Filed: Dec. 17, 1982

[51] Int. Cl.$^4$ ............................................. G01R 31/02
[52] U.S. Cl. ........................................ 324/72; 324/51; 324/102; 361/127
[58] Field of Search ............... 361/127, 126, 128; 324/126, 72, 102, 83 R, 158 R, 51

[56] References Cited

U.S. PATENT DOCUMENTS

| | | | |
|---|---|---|---|
| 3,125,720 | 3/1964 | Swift | 324/72 |
| 3,264,563 | 8/1966 | Arnold | 324/158 D |
| 3,443,223 | 5/1969 | Kennon | 324/72 |
| 3,469,188 | 9/1969 | Hall | 324/102 |
| 4,075,549 | 2/1978 | Woodward | 324/72 |
| 4,157,496 | 6/1979 | St. Jean | 324/72 |
| 4,223,366 | 9/1980 | Sweetana, Jr. et al. | 361/127 |
| 4,327,390 | 4/1982 | Despiney | 324/126 |
| 4,389,693 | 6/1983 | Yanabu et al. | 361/126 |

FOREIGN PATENT DOCUMENTS 1808537  6/1970  Fed. Rep. of Germany ..... 324/72.5
891965  3/1944  France ............................... 324/126

OTHER PUBLICATIONS

Diefenderfer, James A., Principles of Electronic Instrumentation, 2nd Ed., 1979, pp. 101-105.

Primary Examiner—Reinhard J. Eisenzopf
Assistant Examiner—Kevin D. O'Shea
Attorney, Agent, or Firm—G. H. Telfer

[57] ABSTRACT

A metal oxide type surge arrester is provided with a plurality of arrester blocks in series within a housing having, in addition to line and ground terminals at the extremities, a bushing providing a tap voltage terminal intermediate the series stack such as between the bottom two arrester blocks. The provision of the voltage tap and a shunt resistance in series with the ground terminal permits respectively detecting the voltage and the current of the arrester so that they can be compared and their phase relation observed to determine if the arrester blocks are maintaining a capacitive characteristic or have become resistive. In addition, several other methods of use of such an arrester for monitoring line voltage, energy absorption, fault current and the like are disclosed.

5 Claims, 4 Drawing Figures

SURGE ARRESTER EQUIPPED FOR MONITORING FUNCTIONS AND METHOD OF USE

BACKGROUND AND SUMMARY OF THE INVENTION

This invention relates to voltage surge arresters and particularly to those comprising a series stack, or a plurality of series stacks in parallel, of metal oxide arrester blocks without spark gaps.

There has been concern in the past with monitoring the field condition of lightning arresters. It is desirable to know if the arrester is in good condition and doing its protective function. Kennon U.S. Pat. No. 3,443,223, May 6, 1969, is directed to a lightning arrester leakage current and duty monitoring system that includes an instrument package in series with the arrester for the detection and mesurement of leakage current and also for counting the number of times the arrester has discharged. Additional or alternative monitoring capability is desirable, particularly in recently introduced arresters of the type comprising a series stack of metal oxide varistors without spark gaps. The varistors comprise zinc oxide and other metal oxide materials and have a favorable non-linearity characteristic as compared to previously used silicon carbide. As the varistor blocks themselves, rather than any associated spark gaps, are the sole protective elements in the arrester, it is of considerable interest to be able to monitor their condition in the field. This desirability is more pronounced because metal oxide blocks are susceptible to a form of deterioration characterized by a gradual increase in leakage current until thermal runaway eventually occurs which may result in destruction of the blocks.

It has been recognized that metal oxide blocks have an essentially capacitive type characteristic when operated below their turn-on level of voltage, above which they produce a low resistance path. It is therefore known, and utilized in the laboratory, that one may observe the voltage across a zinc oxide block and the phase relation of that voltage with the current to determine if the block is maintaining its desirable substantially capacitive characteristic or is highly resistive. As deterioration occurs, the resistive component of current will increase, gradually exceeding the capacitive current and finally generating more watts of heat resulting in thermal runaway. The use of this lab technique in the field with metal oxide arresters as heretofore constructed has been cumbersome and expensive. It has required a magnetic voltage transformer or a capacitive voltage transformer, normally costing thousands of dollars, to get the necessary voltage indication.

Briefly, in accordance with the present invention, a much simpler yet effective means is provided for giving the voltage indication that can be compared with a coincident current indication to permit a determination of the arrester block condition. This is by utilizing the stack of metal oxide arrester blocks itself as a capacitive voltage divider. Basically, all that is required is an additional voltage tap between the last or bottommost block of the series stack and the adjacent block so that voltage readings may be taken across the last block as desired. Additionally, it is merely necessary that a resistive shunt be connected in series with the stack of blocks, such as between the last block and the ground terminal, so as to permit current detection as has sometimes been done in prior arresters.

A surge arrester so equipped may be utilized in various ways. A principal way is to directly compare tracings of voltage and current over a time period such as on an oscilloscope or recorder in order to determine the phase relation between the voltage and current and to ascertain the condition of the arrester blocks.

A further manner of using an arrester constructed as described above is to have a relay connected between the voltage tap and the ground terminal that is responsive to a predetermined voltage magnitude to conduct and indicate at least normal voltage between the line and ground terminals. In this method of use, upon the detection of a voltage which is less than the threshold normal voltage there is a voltage drop which would be insufficient to close the relay or to keep the relay closed. This would occur upon the occurrence of a fault.

A further use of arresters constructed in accordance with this invention is to measure the magnitude of the tap voltage and to provide by instrumentation or manual calculation a multiplication of that tap voltage by the capacitance ratio $(C_1+C_2)/C_1$ where $C_1$ is the capacitance of the stack of arrester blocks above $C_2$ and $C_2$ is the capacitance of the arrester block across which the tap voltage is taken. This permits the user of the equipment to determine the line voltage magnitude without other equipment. Furthermore, the measurement of current and voltage in the manner described permits detecting and recording the current magnitude upon a current surge when the voltage is clamped to a value indicating occurrence of a fault and a discharge of the arrester. It is useful to the arrester user to know the magnitude of the current surge for the general purpose of monitoring system performance.

A still further method of use is that of employing the measured current and voltage to provide, by the integration of the product thereof over a period of time, the magnitude of energy absorbed by the arrester in that period of time. This is a useful indicator of the energy in a surge, as well as usage of the arrester and can be helpful in determining its available service life.

DESCRIPTION OF THE PREFERRED EMBODIMENTS

Figure 1:
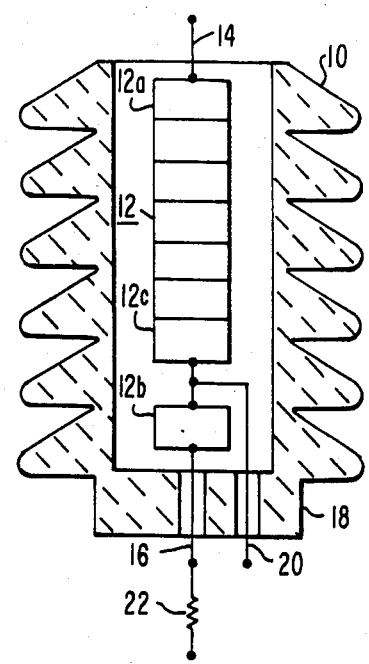
FIG. 1 is an elevation view, partly in section and partly schematic, of a surge arrester in accordance with an embodiment of the present invention.

Referring to FIG. 1, there is shown a surge arrester in accordance with the present invention having an insulating housing 10, such as one of porcelain, within which there are arranged a stack of arrester blocks 12 that comprise metal oxide varistor material that are in direct conductive connection with each other in a series arrangement without spark gaps. Stack 12 may be the only one in the housing or it may be one of a plurality of parallel stacks. At the upper end of the stack 12 there is a connection made from the uppermost block 12a to a line terminal 14 for connection with a power transmission or distribution line with which the arrester is to be associated for the protection of the line or other components thereon. At the lower end of the stack 12 there is a low voltage or ground terminal 16 connected to the bottommost varistor block 12b.

In accordance with the present invention the bottom portion of the housing 10 is constructed to provide a bushing 18 through which a terminal 20 extends that is joined to the midpoint between the bottom and next adjacent varistor blocks 12b and 12c. In the practice of this invention the connection of the voltage tap 20 may also be formed at some other point within the stack 12 and that presented herein is by way of example only. The additional terminal or tap 20 extends through the bushing 16 for exterior utilization in accordance with various methods and arrangements to be hereinafter described. In addition, the ground or low voltage terminal 16 has a small valued shunt resistance 22 in series with it. This resistance 22 may be located as a linear resistance element either within or outside of the housing 10. To simplify construction, it is preferable that the shunt resistance 22 be outside the housing 10 so that the housing construction is not further complicated and there is easy provision for terminal connections on each side of the shunt resistance.

Therefore the construction of the arrester is not strikingly different than that of previous constructions of metal oxide type surge arresters other than the fact that instead of merely having a line terminal 14 and a ground terminal 16 there is provided the additional tap 20 intermediate the stack of arrester blocks to permit obtaining a tap voltage across a small portion, such as just one block, at the lower extremity of the stack 12.

Figure 2:
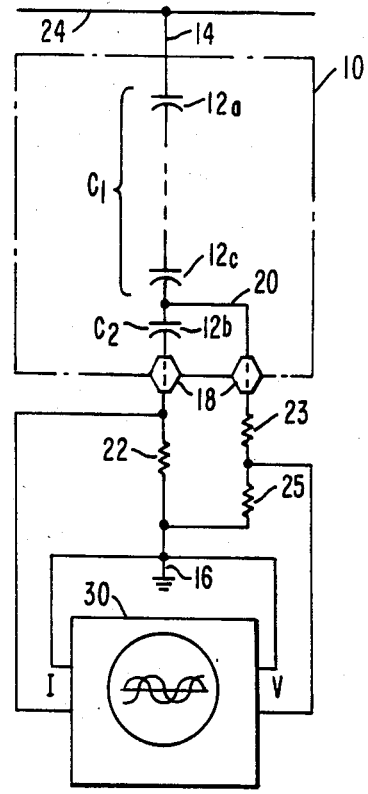
FIG. 2 is a circuit schematic illustrating a use of an arrester in accordance with the present invention.

FIG. 2 illustrates in schematic circuit form one manner of use of the arrester as constructed in accordance with FIG. 1. Each of the metal oxide blocks acts as a capacitor when the voltage across the line is less than that causing turn-on of the arrester blocks to the highly conductive state, so long as the blocks are in good condition. Therefore the blocks are represented as a series string of capacitors 12a, 12c and 12b in the housing 10 across the last of which there is the voltage tap 20 that permits providing a voltage reading for a number of monitoring functions. The shunt resistance 22 at the bottom of the unit in series with the ground terminal 16 permits current detection.

Figure 3:
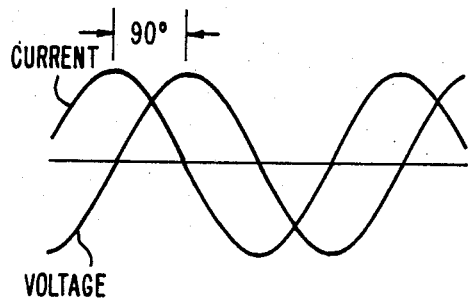
FIG. 3 is a graph of waveforms illustrating the type of results obtained in the use of the arrangement of FIG. 2.

In accordance with FIG. 2 the illustrated arrangement includes connection of the line terminal 14 to a line 24 and connection of ground terminal 16 to ground as in normal operation of the arrester. The voltage tap 20 and ground terminal 16 provide a voltage input V to an oscilloscope 30. The actual voltage applied to the oscilloscope may be reduced by a resistive voltage divider comprising resistors 23 and 25. The scope 30 receives a current input I from leads across the shunt resistor 22. When the arrester is in good condition and operating below turn-on, it will be observed that the current is substantially leading the voltage by about 90° indicating the capacitive nature of that current. This is shown in FIG. 3. However, if the arrester blocks have deteriorated to an extent that a substantial amount of resistive current is conducted thereby, substantially in phase with the voltage, it will be shown in the scope tracings and an observer may therefore utilize this method in order to check on the condition of the blocks. Repeated checks over a long period of time are apt to show a gradual shifting of the current from substantially all capacitive (90° out of phase with the voltage) to less capacitive, and more resistive, current.

Thus, in normal operation, the arrester behaves like a capacitance voltage divider. If the arrester starts to behave like a resistance voltage divider then one knows that the blocks have deteriorated.

Utilizing the arrester as a capacitance voltage divider makes it possible to monitor the voltage on the line 24 because that voltage is inherently equal to the voltage at the tap times the ratio $C_1$ to $C_2$ where $C_1$ is the capacitance of the series string of blocks above $C_2$ and $C_2$ is the capacitance of the block (or blocks) encompassed by the voltage tap 20. This would give the user the added feature of a protected transformer for line voltage measurement. In the steady state, below the turn-on region of metal oxide voltage limiters, the metal oxide stack 12 has the characteristic of the line-to-ground capacitor, much like a coupling capacitor. Above the turn-on region the device looks like a resistor. In either condition, the voltage is divided proportionately as a simple capacitance or resistive divider and hence can be used to indicate line voltage.

For implementing this method of use, it is merely necessary to determine the magnitude of voltage V and multiply it by the known impedance ratio. By tapping a portion of the stack at a low usable voltage and calibrating the tap voltage by a predetermined ratio and phase angle bridge, an accurate measurement of steady state line voltage can be obtained which is the voltage at the tap times the divider ratio. In fact, 60 Hz overvoltage conditions or transient voltages can be accurately measured up to magnitudes about two times normal line to ground voltage, since this is the typical level of conventional arrester sparkover. That is, the arrester blocks are designed to turn-on at such a voltage level.

As an example of the use of the device for checking the line voltage, take the case of a 550 kV rated power system. The nominal line to ground voltage is $550/\sqrt{3} = 318$ kV(rms). A typical metal oxide arrester would have a stack of 159 arrester blocks 12 each of which has about 2 kV of the line voltage across it, when the line voltage is at a normal level. The capacitive current at such a voltage is about 2.0 milliamperes rms. The capacitance value of each block 12 can be shown to be about 2652.5 pf. If the tap 20 is just across the bottom disc 12b, the remaining 158 discs have a capacitance C1 of $2652.5/158 = 16.78$ pf. The ratio $(C_1 + C_2)/C_1$ therefore equals 159.07.

Knowing that ratio and taking a voltage reading at the voltage tap (such as 2.0 kV when the voltage is normal) permits line voltage calculation, that is, $(2.0 \times 159) = 318$ kV.

Figure 4:
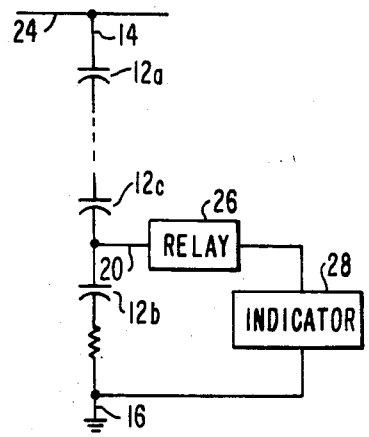
FIG. 4 is a circuit schematic illustrating a further use of an arrester in accordance with the present invention.

Another monitoring use of the arrester with voltage tap 20 is to connect it as shown in FIG. 4. Here a low energy solid state relay 26 or other voltage sensitive device is placed across the tap in series with an indicating device or circuit 28. This gives a line fault indication if the line voltage drops and conduction of the relay 26 ceases. This would give better subsidence transient response than a coupling capacitor voltage transformer and can be used when the metal oxide arrester is used on the line side or for line protection. This permits the line fault to be pinpointed to a particular zone of the system as has previously been done with distance relays and potential transformers or capacitively coupled voltage transformers.

A still further use of the device as constructed in accordance with this invention is to provide all inputs necessary to determine the magnitude of a current surge and/or the energy of a surge. The voltage V is measured at the tap and the current magnitude I across shunt resistor 22. Energy can thus be calculated manually or through an electrical integrator giving the product of voltage×current×time resulting in energy (Joules).

It can therefore be seen that through the simple expedient of providing a voltage tap in a gapless metal oxide type arrester numerous monitoring functions can be provided for use in the field when the arrester is on a line and these monitoring functions permit a better understanding of the performance of the arrester and its condition.

I claim:

1. A surge arrester equipped for monitoring functions comprising:
    a plurality of arrester blocks, each comprising a metal oxide varistor, stacked in a directly connected series conductive relationship having no spark gaps;
    a housing enclosing said plurality of arrester blocks;
    a line terminal connected with a first of said arrester blocks and extending from said housing for connection with an AC line;
    a ground terminal connected with a second of said arrester blocks remote from said first arrester block and extending from said housing for connection with an electrical ground;
    a voltage tap connected to said plurality of arrester blocks at a location at least one arrester block removed from the location of said ground terminal, said voltage tap extending from said housing;
    voltage indicating means connected between said voltage tap and said ground terminal and current indication means connected across a resistive shunt in series with said ground terminal.

2. A method of monitoring a surge arrester constructed in accordance with claim 1 comprising:
    obtaining a trace of voltage between said voltage tap and said ground terminal over a period of time in the absence of a fault while the arrester is connected between a line and ground;
    obtaining a trace of current through said resistive shunt over substantially the same period of time;
    comparing the phase relation of said voltage trace and said current trace over said period of time to determine whether said current is substantially capacitive indicating the proper functioning of said arrester blocks or is substantially resistive indicating deterioration of arrester block performance.

3. A method of monitoring fault currents a surge arrester constructed in accordance with claim 1 comprising:
    measuring the magnitude of current through said resistive shunt while the arrester is connected between a line and ground;
    measuring the magnitude of voltage across said voltage tap and said ground terminal coincident with the measuring of said current;
    detecting and recording said current magnitude upon a current surge when said voltage drops to a low value indicating occurrence of a fault.

4. A method of monitoring an arrester constructed in accordance with claim 1 comprising:
    measuring the magnitude of current through said resistive shunt while the arrester is connected between a line and ground;
    measuring the magnitude of voltage across said voltage tap and said ground terminal coincident with the measuring of said current;
    integrating the product of said current and said voltage magnitudes over a period of time t to determine the amount of energy absorbed by the arrester in said period of time.

5. A method of monitoring fault currents utilizing a surge arrester having a plurality of arrester blocks stacked in a series conductive relationship, a housing enclosing said plurality of arrester blocks, a line terminal connected with a first of said arrester blocks and extending from said housing for connection with an AC line, a ground terminal connected with a second of said arrester blocks remote from said first arrester block and extending from said housing for connection with an electrical ground; and a voltage tap connected to said plurality of arrester blocks at a location at least one arrester block removed from the location of said ground terminal, said voltage tap extending from said housing comprising the steps of:
    measuring the magnitude of tap voltage occurring across said voltage tap and said ground while said arrester is connected between a line and ground terminal;
    determining the magnitude of line voltage by multiplying said tap voltage by the ratio of capacitance $(C_1+C_2)/C_1$ where $C_1$ is the capacitance of said plurality of arrester blocks above said voltage tap and $C_2$ is the capacitance of said at least one arrester block across which said tap voltage is taken.

* * * * *